United States Patent [19]
Mettler

[11] Patent Number: 5,543,613
[45] Date of Patent: Aug. 6, 1996

[54] MULTI-DIGIT FLUID FLOW ROLLER METER

[75] Inventor: Roland Mettler, Kriens, Switzerland

[73] Assignee: GWF Gas & Wassermesserfabrik AG, Lucerne, Switzerland

[21] Appl. No.: 268,529

[22] Filed: Jul. 6, 1994

[30] Foreign Application Priority Data

Jul. 11, 1993 [CH] Switzerland ............ 02 059/93

[51] Int. Cl.⁶ ............................................. G01D 5/34
[52] U.S. Cl. ................................. 250/231.15; 324/142
[58] Field of Search ................ 250/231.14, 231.15, 250/231.18; 324/142, 96, 164, 165, 175; 73/54.08, 861.88, 861.93, 861.94, 197; 340/870.01, 870.02, 870.18, 870.19

[56] References Cited

U.S. PATENT DOCUMENTS

| | | | |
|---|---|---|---|
| 3,732,404 | 5/1973 | Jones | 235/113 |
| 4,037,219 | 7/1977 | Lewis | 250/231.15 |
| 4,437,098 | 3/1984 | Rosinck et al. | 250/231.18 |
| 4,683,472 | 7/1987 | Beling | 340/870.02 |

FOREIGN PATENT DOCUMENTS

| | | |
|---|---|---|
| 202722 | 11/1986 | European Pat. Off. . |
| 2199115 | 4/1974 | France . |
| 2666886 | 3/1992 | France . |
| 4129785 | 9/1990 | Germany . |

*Primary Examiner*—Edward P. Westin
*Assistant Examiner*—Que T. Le
*Attorney, Agent, or Firm*—Greenblum & Bernstein P.L.C.

[57] ABSTRACT

A multi-digit roller meter with encoder for the electronic read-out of a volume measuring instrument or a current measuring instrument, which during the twisting or turning of sensors in relation to the indicator wheels through a determined angle, allows the determination of the instantaneous indicator reading via markings placed on the indicator wheels in irregular spacings.

14 Claims, 4 Drawing Sheets

MULTI-DIGIT FLUID FLOW ROLLER METER

CROSS REFERENCE TO RELATED APPLICATIONS

This application claims the priority of Swiss Application No. 02 059/93-5, filed Jul. 11, 1993, the disclosure of which is incorporated herein by reference in its entirety.

BACKGROUND OF THE INVENTION

1. Field of the Invention

This invention pertains to a multi-digit roller meter for volume or current measurement whose indicator reading can be electronically read by means of an encoder that is activated for each reading.

2. Discussion of the Background of the Invention and Material Information

Volume measuring devices or instruments for gas and water, as well as electric meters for the measurement of energy flowing therethrough, are known, in which the measured volume or the measured energy is transferred via a step down mechanism, associated with the measuring instrument, to a mechanical roller meter. The roller meter shows, since its last zero setting or resetting, the volume that has passed therethrough since its resetting. In order to determine the usage during a specified period, the setting of the roller meter is read at the beginning and end of this period. A preferred embodiment of the roller meter consists of having an axis upon which the indicator wheels or cipher rolls are rotatably journalled and upon whose circumference the numerals 0 to 9 are placed, as well as having a second axis, with rotatable shift pinion wheels, in such a way that each time the lower value indicator wheel, in the last tenth of a revolution, via its allocated shift pinion wheel, shifts the next higher value wheel one tenth of a revolution. A typical roller meter for a water flow measuring instrument is set forth in prior art French Patent Publication 2.199.115. Depending upon the construction of the measuring instrument, in order to achieve extensive measuring range while maintaining good measuring accuracy, it is important that the required moment of torsion or moment of rotating is held to the lowest possible value.

Prior art U.S. Pat. No. 3,732,404 teaches a solution for the electronic readout of a meter in which the continuous turning movement of the indicator wheels is translated into a snapping motion. It must be assured that the spring or other mechanism, that is utilized for the snapping motion, obtains sufficient energy in order to advance the entire wheel or roller package one setting, for example from 19999 to 20000.

European Patent Publication No. EP 202722 B1 teaches a solution which permits the electronic readout of a meter of the needle type via the use of mechanical contacts without snap motion. Naturally it is also possible to utilize a meter of the needle type in synchronization with a meter having indicator wheels or cipher rolls.

SUMMARY OF THE INVENTION

It is the task or object of the present invention to digitally electronically read out the indicator reading of a roller meter in a measuring instrument with the simplest possible means, at any desired moment in time, without having to significantly increase the means that produce the moment of torsion that is required to drive the roller meter.

In accordance with the present invention, rotatable sensors are interposed between the indicator wheels which react to markings that are irregularly spaced from each other on the indicator wheels. For example, the markings can be placed in spacings of 9°, 72°, 27°, 63°, 36°, 54°, 18°, 81° around the periphery of the indicator wheel. By means of the twisting of the sensors for at least 99°, at least two markings are recognized. From the angular distance between two markings it can be deduced which of the two markings is at issue, and at the same time, the position of one of the markings can be utilized to determine the position of the indicator wheel.

Advantages of the present invention include a small angle of rotation for the sensors and a very low increase in friction.

A preferred embodiment or construction of the sensors is comprised of radially or axially placed light barriers which recognize openings or webs as makings. Another sensor variation is comprised of induction sensors with materials of differing eddy current damping capacity or magnetization, as markings.

Specifically, this invention pertains to a multi-digit roller meter for a volume measuring instrument for one of gas and water or for an electricity meter, having a plurality of indicator wheels rotatable on a common axis of rotation in which, every time, of two adjacent differing value indicator wheels, the higher value wheel is turned one tenth of a revolution further, via a shift pinion wheel, by the lower value indicator wheel in the last tenth of its revolution, the multi-digit roller meter including a first device, rotatable through an angle of less than 360° and located on one of the axis of the indicator wheels and on an axis parallel to the axis of the indicator wheels, is arranged between each of the indicator wheels; the first device, during a rotation relative to the indicator wheels, gives off at least two signals; a second device, the second device producing signals for the recognition of the instantaneous turning angle of the first device; and a logical linkage between the signals of the first device and the turning angle signals of the second device in a manner so that from the relative and absolute position of the signals of the first device the instantaneous angle setting of each indicator wheel is determined.

In one embodiment of this invention, the first devices, that are rotatable through an angle of less than 360° for the production of at least two signals, are each comprised of forked light barriers, each of the light barriers being radially arranged on an arm, with the light beam of each light barrier being interrupted by markings arranged on the indicator wheel. Preferably, the markings take the form of ring segments of differing length.

In another embodiment of this invention, the first devices, that are rotatable through an angle of less than 360° for the production of at least two signals, are comprised of two arms; upon each of the arms, on one side of the markings of the indicator wheels, a light receiver is attached and on the other side of the markings a light source is attached, with the light beam of the light source being released via openings unevenly spaced in indicator wheels.

In a further embodiment of this invention, the light beam is released in differing lengths due to the uneven spacing of the openings.

In an additional embodiment of this invention, the first devices, that are rotatable through an angle of less than 360°, are comprised of arms upon each of which a magnetic field sensor is attached, with the field sensor, due to magnets of differing strength that are attached to the indicator wheels, giving off at least one signal during the rotation of the indicator wheels.

In yet another embodiment of this invention, the first devices, that are rotatable through an angle of less than 360°, are comprised of arms upon each of which a magnetic field sensor is attached, with the field sensor, due to magnets that are attached at unequal spacing to the indicator wheels, giving off at least two signals during the rotation of the indicator wheels.

In still a further embodiment of this invention, the first devices, that are rotatable through an angle of less than 360°, are comprised of arms upon each of which a magnetic field sensor is attached, with the field sensor, due to magnetizable parts of varying strength that are attached to the indicator wheels, giving off one or more signals, during the rotation of the indicator wheels.

In yet a further embodiment of this invention, the first devices, that are rotatable through an angle of less than 360°, are comprised of arms upon each of which a magnetic field sensor is attached, with the field sensor, due to magnetized parts that are attached at unequal spacing to the indicator wheels, giving off at least two signals during the rotation of the indicator wheels.

In yet an additional embodiment of this invention, due to the twisting or turning of the first device the indicator wheels are turned to their limit stop. This twisting or turning is preferably accomplished via a friction clutch.

In still another embodiment of this invention, the second device, for the recognition of the instantaneous turning angle of the first device, is comprised of a slotted disk, the slotted disk being rotatably coupled with the first device and an additional fixed forked light barrier.

In a final embodiment of this invention, the first devices are twisted or turned by a stepping motor, via a step down gear train and the number of steps of the stepping motor are used for the recognition of the instantaneous turning angle of the first device.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components and wherein.

DETAILED DESCRIPTION OF THE PREFERRED EMBODIMENTS

With respect to the drawings it is to be understood that only enough of the construction of the invention and the surrounding environment in which the invention is employed have been depicted therein, in order to simplify the illustrations, as needed for those skilled in the art to readily understand the underlying principles and concepts of the invention.

Figure 1:
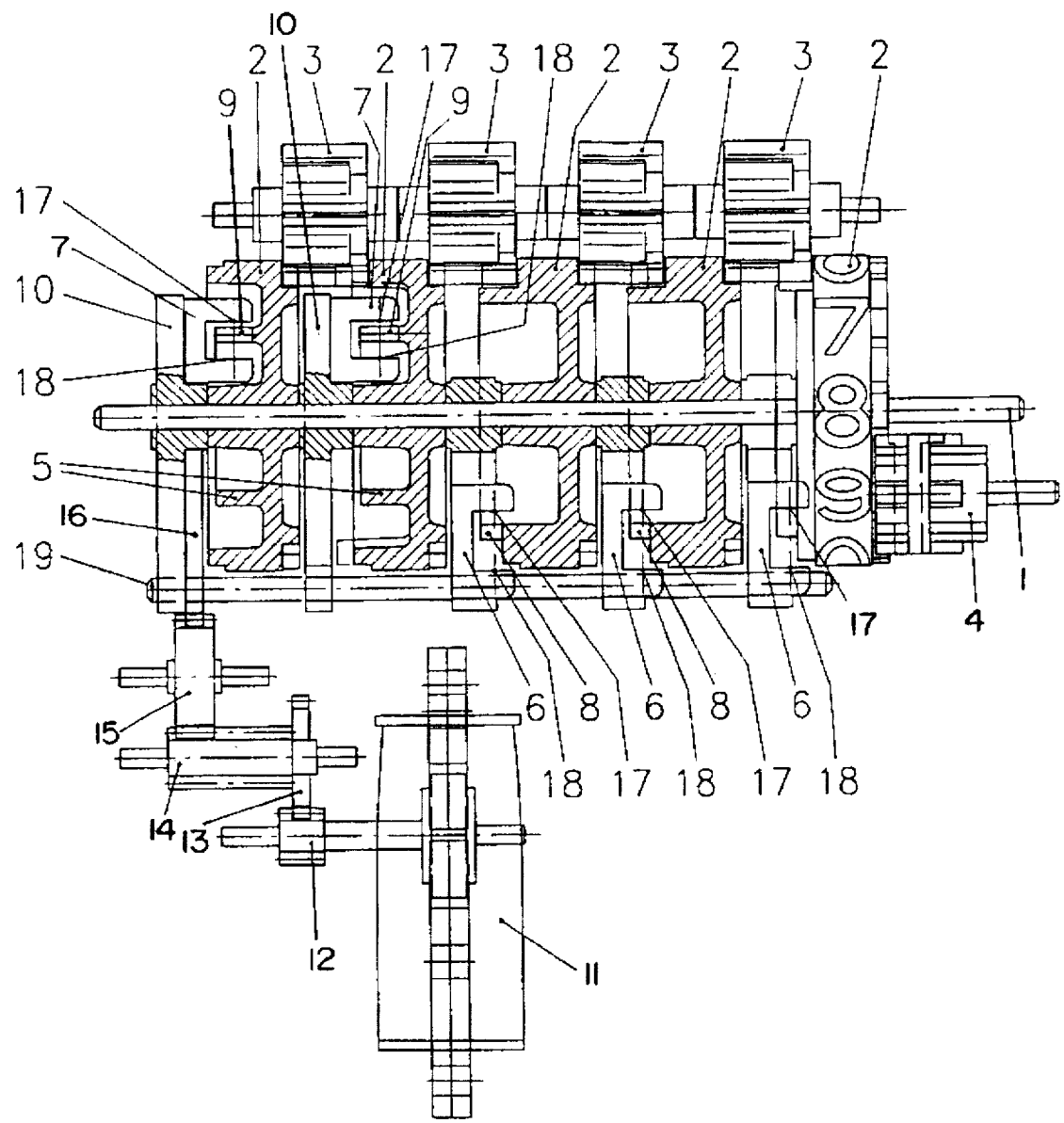
FIG. 1 is longitudinal, vertical section of a first constructional example of the multi-digit roller meter with encoder of this invention which utilizes a fork or clevis-mounted light barriers.
Figure 2:
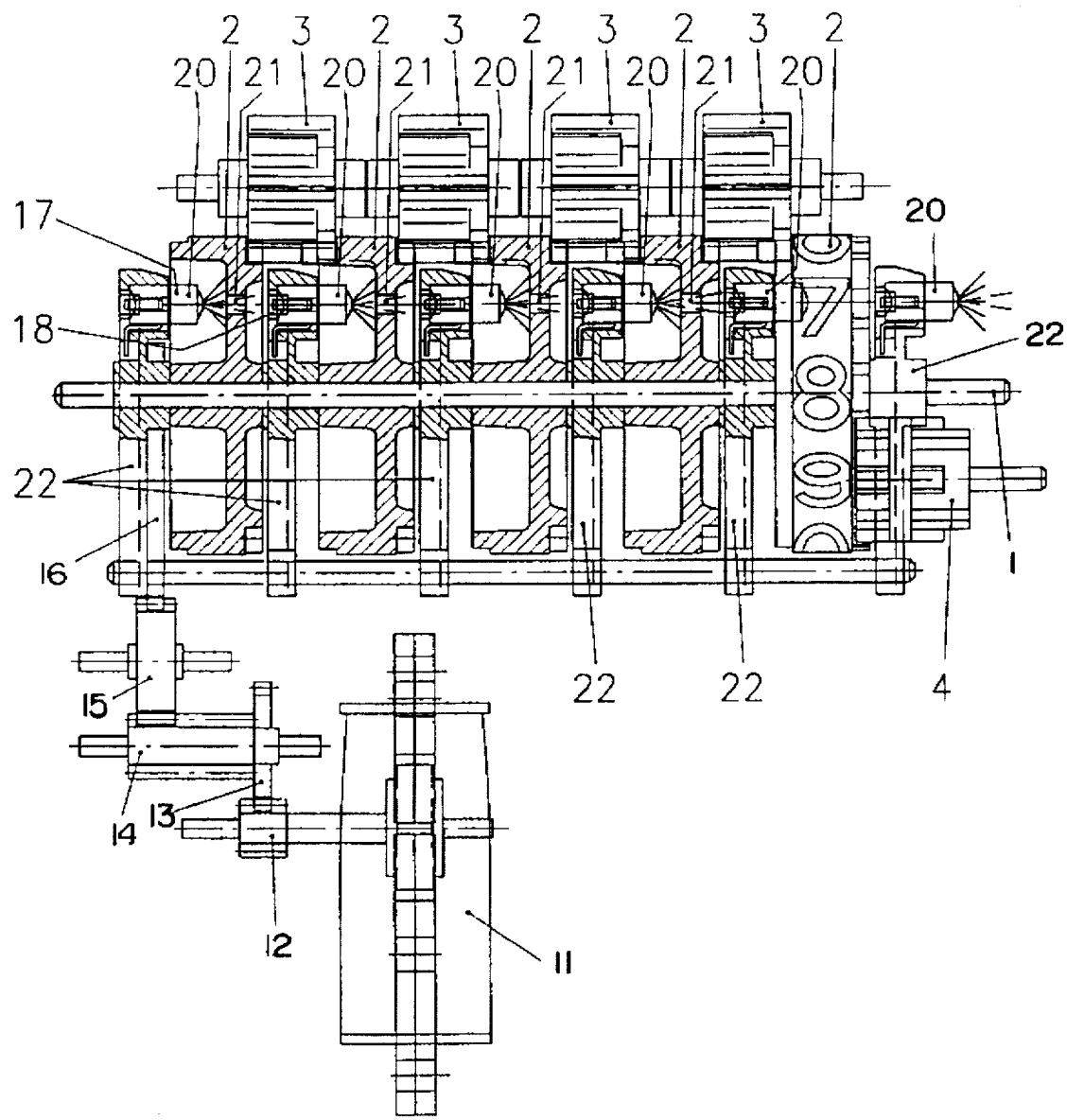
FIG. 2 is a longitudinal, vertical section of a second constructional example which utilizes axial light barriers.
Figure 3:
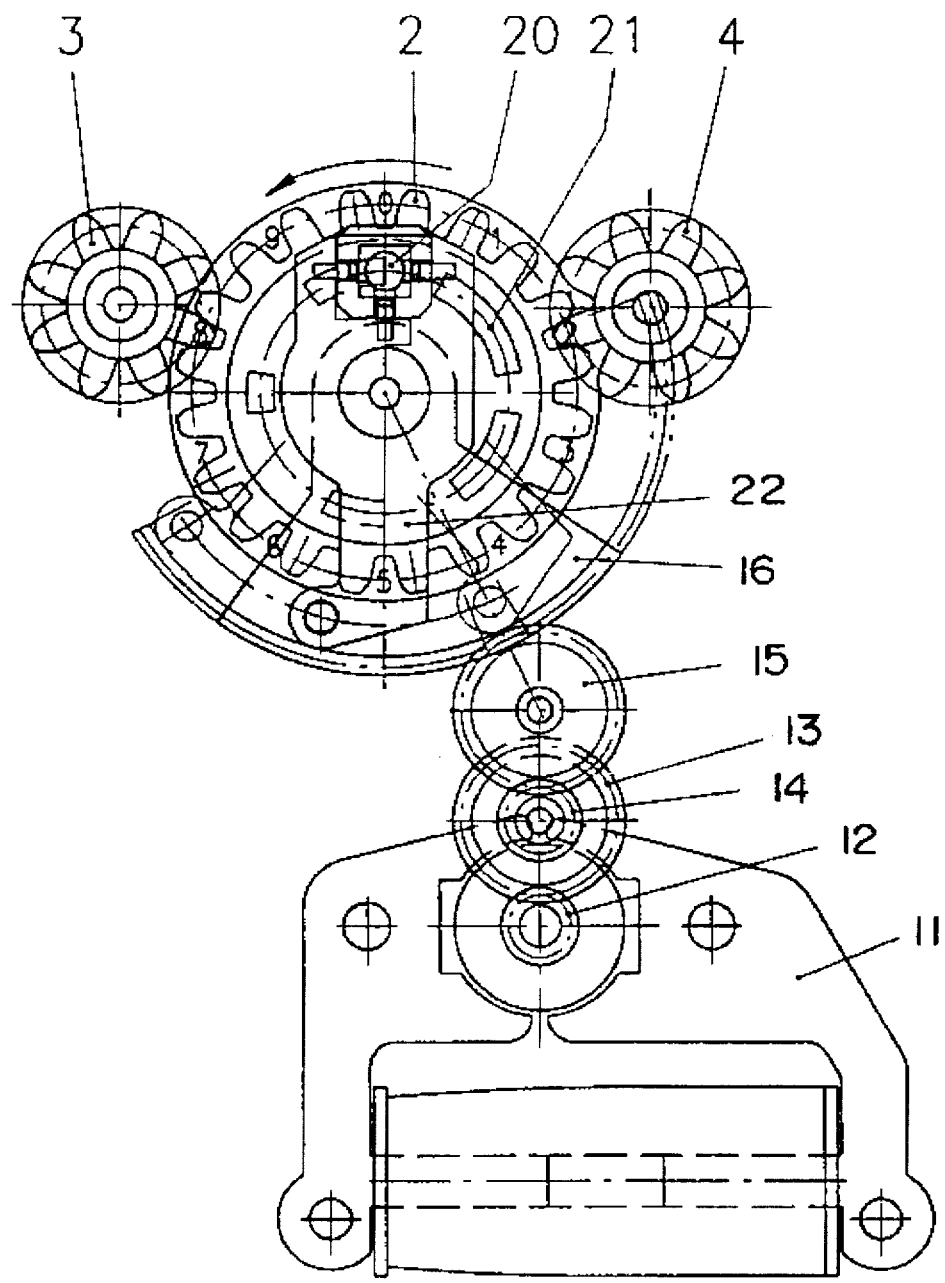
FIG. 3 is an end or side view of the FIG. 2 second constructional example.
Figure 4:
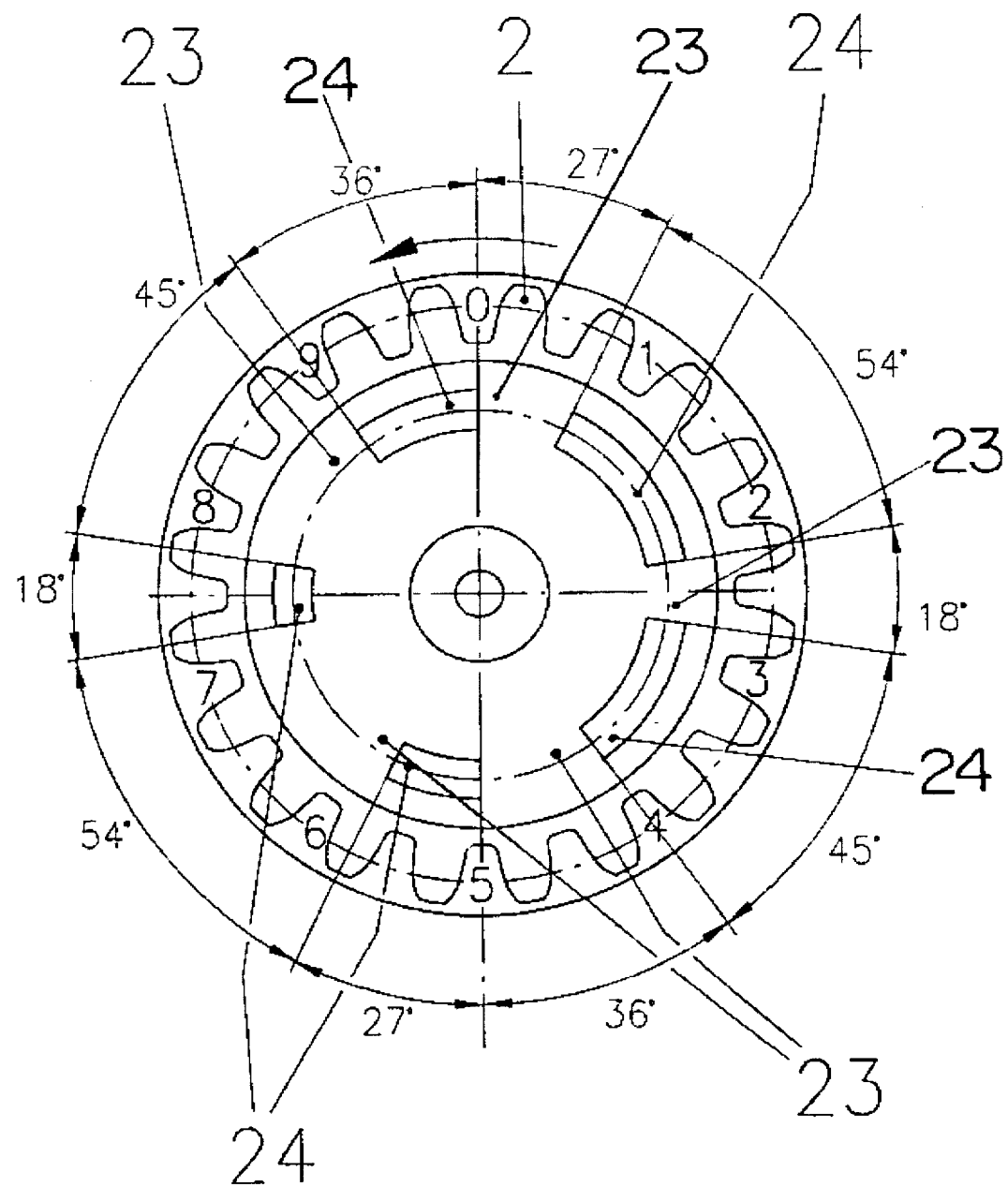
FIG. 4 is an enlarged view of the indicator wheel of the FIG. 3 second constructional example.

In the following description, constructional details and functions will be described for a construction that utilizes optical sensors. One such a preferred construction of the optical sensors is comprised of light barriers which are attached on arms. FIG. 1 shows a first constructional example with fork or clevis light barriers, with FIGS. 2 to 4 showing a second constructional example with axial light barriers.

In the roller meter illustrated in FIG. 1, several indicator wheels or cipher rolls 2 are freely rotatably arranged on an indicator wheel axis 1, which wheels or rolls are mechanically interconnected via shift pinion wheels 3. Shift pinion wheels 3, in turn, are arranged on a separate shift pinion axis. The lowest value indicator wheel 2 is actuated via a gear wheel 4 for timing purposes. Indicator wheels 2 are visually readable as usually via a non-illustrated shutter, screen or lens in a known manner.

For the electronic readout, indicator wheels 2 are provided, at a predetermined radius, with markings 5, preferably in the form of raised ring segments of differing widths, which will be discussed in more detail with reference to the second constructional example. Interposed between indicator wheels 2 are first devices or means in the form of fork or clevis light barriers 6, 7 for the detection of the counter reading, with light barriers 6, 7 either encompassing an outer rim 8 or an inner crown or an inner rim 9 of indicator wheels 2. Numeral 7 refers to the two light barriers located to the left and above indicator wheel axis 1 (FIG. 1) and numeral 6 refers to those three light barriers that are located to the right and below indicator wheel axis 1 (FIG. 1). Denominated as the inner rim 9 is a slightly axially extending annular edge having a small radius and segmented raised areas (markings 5), extending from the two left (FIG. 1) indicator wheels 2. Denominated as the outer rim 8 is the slightly axially extending annular edge having a larger radius and segmented raised areas (markings 5) extending from the three right (FIG. 1) indicator wheels 2. The term "markings" is used in a generic sense and it is to be understood as being independent of any tangible embodiment thereof and thus also applying, for example, to reflective markings, segmented slits 24 (to be discussed hereinafter with reference to FIG. 4) or also to light-blocking webs or fillets 21 (to be discussed hereinafter with reference to FIGS. 2 and 3). The actual number of light barriers 6, 7 and the inner rims 9 or outer rims 8, respectively scanned therewith is shown in FIG. 1. Two light barriers 7 scan two inner rims 9 and three light barriers 6 scan three outer rims 8. There are as many light barriers 6, 7 and inner/outer rims 9, 8 as there are indicator wheels 2, that is, as per FIG. 1, five light barriers total. Outer rims 8 and inner rims 9 can also be denominated as "code rims" for ease of understanding. On the ends of the forks, facing one another, are a light source 17 and a light receiver or optical sensor 18. Light barriers 6, 7 are attached to disk-shaped or lever-shaped arms 10, with a rod 19 extending through arms 10 for radially coupling together arms 10 radially outwardly of indicator wheels 2, thereby permitting the synchronous twisting or turning thereof. In another constructional variation, arms 10 are fixed against rotation on indicator wheel axis 1 and thus turn with axis 1.

In order to achieve a low moment of torsion or rotation of sensor arms 10, it is appropriate to balance arms 10 with reference to turning axis 1. It is advantageous, for the guiding of the leads or conductors to light barriers 6, 7, to utilize highly flexible wire strands or individual wires.

The drive means for the turning movement of light barriers 6, 7 takes the form of a stepping motor 11 which is preferably coupled with rod 19 via a gear train comprised of meshing gear wheels 12, 13, 14, 15, 16, with joined gear wheels 13, 14 having a common axis. In order to improve the life span of the light barriers, a friction clutch can be coupled to the outlet side of the stepping motor 11 which prohibits the twisting or turning of arms 10 past a fixed stop, preferably beyond 99°. Miniature stepping motors which make a 180° rotation per step, are well known. With the use of a 1:20 step down or reduction gear train of gear wheels 12, 13, 14, 15 and 16, sensors 18 are twisted or turned 9° per step. Counting of the executed steps enables the determination of the instantaneous angle of rotation of arms 10, with stepping motor 11 thereby serving, simultaneously, as a second device or means for the detection of the counter reading.

In order to obtain an electronic readout, arms 10 are turned or twisted 99° relative to indicator wheels 2. At the same time, light barriers 6, 7 give off signals during the passing of markings 5 past the inner and outer rims 8, 9, respectively. Preferably, each time, the switch mode of a bistable circuit or flip flop is changed.

FIG. 2 illustrates a construction that utilizes axial light barriers 20 which, during twisting or turning, relative (FIG. 4) 2, during the movement past openings 24 in the indicator wheels, which in turn serve as markings 21, produce signals relative to indicator wheels 2. The structure and function of this embodiment will be explained in more detail with reference to FIGS. 3 and 4.

FIG. 3 illustrates a side view in accordance with FIG. 2 and shows differing turning positions of light barrier 20 on arms 22. Indicator wheels 2 carry markings 21 in the form of axial break-throughs or openings 24 (FIG. 4) having webs or fillets 23 located therebetween.

FIG. 4 illustrates a preferred construction of markings 21 for axial light barriers in the form of an arrangement of webs 23 and openings 24. Webs 23 are arranged at angles of 27°, 18°, 36°, 54° and 45°. Located therebetween are respective openings 24 that are arranged at angles of 54°, 45°, 27°, 18° and 36°. During each change from web to opening and vice versa light barrier 20 always gives off a signal and a switch is switched over in a manner to be explained in more detail hereinafter.

Openings 24 are generally unequally spaced around the periphery or circumference of the indicator wheels and can, additionally, be of different length. Markings 5, 21 can also be comprised of magnet segments or magnets of differing strength, which are recognized by a magnetic field sensor or a sensor that is capable of being magnetized. In this non-illustrated construction, only a single sensor on one side of each indicator wheel 2 is required.

The roller meter operates in a conventional mechanical manner. In every two indicator wheels 2 the higher value indicator wheel is turned by the rotation of the lower value indicator in the last tenth of its revolution, via the intermediate shift pinion wheel 3, for one tenth of a revolution. The prevailing counter reading can be read by means of a screen or shutter. In addition, or if necessary, the meter can also be read exclusively electronically.

For the electronic readout of the roller meter, stepping motor 11 is activated and advanced eleven steps or 99°. During each step, the signals, received from light barriers 6, 7, 20, for each indicator wheel 2, are registered. These signals are always coordinated or allocated with a predetermined step, i.e., coordinated or allocated with the turning signal angle of the stepping motor, via a logical linkage. During a comparison with the stored marking pattern, for example successive markings in the spacings of 9°, 72°, 27°, 63°, 36°, 54°, 18° and 81°, the instantaneous turning position for each counter roll and thus the indicated numerical value can be determined.

The production of signals takes place via the embodiment illustrated in FIG. 1 in that the light beam (light source 7) is alternately interrupted via the segmented raised areas (markings 5) and not interrupted between the segmented raised areas (markings 5) which is registered at the receiver portion (light receiver or optical sensor 18) of light barriers 6, 7 as dark or light and causes the production, at the outlet of the internal receiver circuit of the light barriers, of a corresponding logic signal "0" or "1". The term "switch" thus denominates this electronic switching which is well known in the art and in the jargon of this art is, as already noted, known as a "bistable flip-flop".

An arbitrary instantaneous setting of indicator wheels 2 occurs even when light barriers 6, 7 are at rest (not being rotated), that is at their signal outlets, logic signals "0" or "1" depend upon whether the light beams are, at that time, being interrupted or uninterrupted via the segmented raised areas (markings 5). The static "reading" of the relatively course marking example (FIGS. 3 and 4, elements 21 and 24 respectively) initially provides approximate information about the instantaneous setting of indicator wheels 2 and thus the meter indication of the counter being read in the form of five parallel logic signals, comparable with a five digit binary number.

The device with the scanning light barriers is generally defined as a "first device" which is illustrated in a first embodiment (FIG. 1) and a second (FIG. 2) exemplary embodiment.

The disc or lever-type arms, rotatably arranged on indicator wheel axis 1, successively adjacent to indicator wheels 2, carry light barriers 6, 7 and are mechanically coupled with each other via a continuous rod 19 that extends axially and parallel with indicator wheel axis 1. The left disc or lever-type arm 10, adjacent to the highest value left indicator wheel 2, includes, at its outer edge and over an angle of about 120°, a radial serration, as part 16 (FIG. 3) of a transmission gear train, having gears 12, 13, 14 and 15, that is driven by means of stepping motor 11. This apparatus or unit, which drives the disc or lever-type arms 10 that carry light barriers 6, 7, is defined as a "second device".

The "second device" turns the "first device" for a scanning or reading operation, via eleven steps of 9° each, for a total of 99°, wherein the logic signals emanating from the outputs of light barriers 6, 7, 20, are detected and stored, prior to the step-wise turns and between each step, in a known manner. It is in this manner, in a timed sequence of twelve times, that five logic signals each time, are determined by light barriers 6, 7 and 20 and are assembled into a corresponding bit pattern or configuration for subsequent further treatment.

The corresponding bit configuration is known for each counter setting and, for example, is already previously stored in tabular form. During the counter reading determination, the read bit configuration is used to locate the stored equivalent and thus correspondence with the actual counter setting is achieved.

The operating principle of the stepping motor is deemed to be well known, wherein the suggested stepping motor 11 is stepwise advanced with 180° steps, via defined number of electrical pulses at a predetermined frequency. Data processing procedures can be accomplished by one skilled in the art without further explanations and thus have only been explicitly been referred to in this description.

While there are shown and described present preferred embodiments of the invention, it is to be distinctly understood that the invention is not limited thereto, but may be otherwise variously embodied and practiced within the scope of the following claims and the reasonably equivalent structures thereto. Further, the invention illustratively disclosed herein may be practiced in the absence of any element which is not specifically disclosed herein.

What is claimed is:

1. A multi-digit roller meter for a volume measuring instrument for one of gas and water or for an electricity meter, having a plurality of adjacent indicator wheels of differing values rotatable on a common axis of rotation in which, every time, of two adjacent differing value indicator wheels, a higher value wheel is turned one tenth of a revolution further, via a shift pinion wheel, by a lower value indicator wheel in the last tenth of its revolution, the multi-digit roller meter including:

- a plurality of first devices wherein each first device, rotatable through an angle of less than 360° and located on one of the axis of the indicator wheels and an axis parallel to the axis of the indicator wheels, is arranged between each of two adjacent ones of the plurality of indicator wheels;
- each first device, during a rotation relative to the adjacent indicator wheels, gives off two different signals;
- a second device, drivingly interconnected with said first devices, said second device causing a sequence of multiple reading steps of said first devices, via angular movements of said first devices; and
- the sum of the signals of said multiple reading steps of said first devices representing a certain, specific meter position.

2. The multi-digit roller meter of claim 1, wherein first devices, that are rotatable through an angle of less than 360° for the production of said two different signals, are each comprised of forked light barriers, each of the light barriers being radially arranged on an arm, with a light beam of each light barrier being interrupted by markings arranged on the associated indicator wheel, wherein the markings take the form of ring segments of differing lengths.

3. The multi-digit roller meter of claim 2, wherein the first devices, that are rotatable through an angle of less than 360° for the production of said two different signals, are comprised of arms; upon each of the arms, on one side of the markings on each of the indicator wheels, a light receiver is attached and on the other side of the markings a light source is attached, with the light beam of the light source being released via openings in the indicator wheels, with said openings being unevenly spaced.

4. The multi-digit roller meter of claim 3, wherein the light beam is released in differing lengths due to the uneven spacing of the openings.

5. The multi-digit roller meter of claim 1, further including the attachment of magnets to the indicator wheels, said magnets being of differing strength, wherein the first devices, that are rotatable through an angle of less than 360°, are comprised of arms upon each of which a magnetic field sensor is attached, with each field sensor, due to magnets of differing strength that are attached to the indicator wheels, giving off said two different signals during the rotation of the indicator wheels.

6. The multi-digit roller meter of claim 1, further including the attachment of magnets to the indicator wheels, said magnets being attached at an unequal spacing, wherein the first devices, that are rotatable through an angle of less than 360°, are comprised of arms upon each of which a magnetic field sensor is attached, with each field sensor, due to magnets that are attached at said unequal spacing to the indicator wheels, giving off said two different signals during the rotation of the indicator wheels.

7. The multi-digit roller meter of claim 1, further including the attachment of magnetizable parts to the indicator wheels, said magnetizable parts being of varying strength, wherein the first devices, that are rotatable through an angle of less than 360°, are comprised of arms upon each of which a magnetic field sensor is attached, with each field sensor, due to said magnetizable parts of varying strength that are attached to the indicator wheels, giving off said two different signals, during the rotation of the indicator wheels.

8. The multi-digit roller meter of claim 1, further including the attachment of magnetizable parts to the indicator wheels, said magnetizable parts being attached at an unequal spacing, wherein the first devices, that are rotatable through an angle of less than 360°, are comprised of arms upon each of which a magnetic field sensor is attached, with each field sensor, due to said magnetizable parts that are attached at said unequal spacing to the indicator wheels, giving off said two different signals during the rotation of the indicator wheels.

9. The multi-digit roller meter of claim 1, further including a stepping motor and a step down gear train, wherein the first devices are rotated by said stepping motor and said step down gear train and the number of steps of the stepping motor are used for the step-wise rotation of said first device.

10. The multi-digit roller meter of claim 2, further including a stepping motor and a step down gear train, wherein the first devices are rotated by said stepping motor and said step down gear train and the number of steps of the stepping motor are used for the step-wise rotation of said first device.

11. The multi-digit roller meter of claim 3, further including a stepping motor and a step down gear train, wherein the first devices are rotated by said stepping motor and said step down gear train and the number of steps of the stepping motor are used for the step-wise rotation of said first device.

12. The multi-digit roller meter of claim 5, further including a stepping motor and a step down gear train, wherein the first devices are rotated by said stepping motor and said step down gear train and the number of steps of the stepping motor are used for the step-wise rotation of said first device.

13. The multi-digit roller meter of claim 6, further including a stepping motor and a step down gear train, wherein the first devices are rotated by said stepping motor and said step down gear train and the number of steps of the stepping motor are used for the step-wise rotation of said first device.

14. The multi-digit roller meter of claims 7, further including a stepping motor and a step down gear train, wherein the first devices are rotated by said stepping motor and said step down gear train and the number of steps of the stepping motor are used for the step-wise rotation of said first device.

* * * * *